(12) United States Patent
Drye

(10) Patent No.: US 9,030,066 B2
(45) Date of Patent: May 12, 2015

(54) ELECTRIC MOTOR WITH MULTIPLE POWER ACCESS

(75) Inventor: Edward L. Drye, Troy, OH (US)

(73) Assignee: Regal Beloit America, Inc., Beloit, WI (US)

( * ) Notice: Subject to any disclaimer, the term of this patent is extended or adjusted under 35 U.S.C. 154(b) by 588 days.

(21) Appl. No.: 13/285,798

(22) Filed: Oct. 31, 2011

(65) Prior Publication Data

US 2013/0106217 A1 May 2, 2013

(51) Int. Cl.
  *H02K 5/04* (2006.01)
  *H02K 5/22* (2006.01)
  *H02K 9/14* (2006.01)
  *H02K 11/00* (2006.01)

(52) U.S. Cl.
  CPC *H02K 9/14* (2013.01); *H02K 5/225* (2013.01); *H02K 11/0073* (2013.01)

(58) Field of Classification Search
  USPC ....................................................... 310/89, 71
  See application file for complete search history.

(56) References Cited

U.S. PATENT DOCUMENTS

| | | | |
|---|---|---|---|
| 3,353,068 A | 11/1967 | Turk | |
| 4,339,231 A | 7/1982 | Conery et al. | |
| 4,628,236 A | 12/1986 | Schaefer | |
| 4,782,244 A * | 11/1988 | Wakimoto | 307/116 |
| 5,192,888 A * | 3/1993 | Fleer | 310/71 |
| 5,256,834 A | 10/1993 | Gehring | |
| 5,763,969 A * | 6/1998 | Metheny et al. | 310/62 |
| 6,091,604 A * | 7/2000 | Plougsgaard et al. | 361/707 |
| 7,140,090 B2 | 11/2006 | Williams et al. | |
| 7,473,079 B2 * | 1/2009 | Ogawa et al. | 417/410.5 |
| 7,687,945 B2 * | 3/2010 | Matin et al. | 310/64 |
| 7,821,220 B2 * | 10/2010 | El-Ibiary | 318/600 |
| 7,965,005 B2 * | 6/2011 | Schmidt et al. | 310/71 |
| 8,007,255 B2 * | 8/2011 | Hattori et al. | 417/410.1 |
| 8,043,070 B2 * | 10/2011 | Stiles et al. | 417/44.1 |
| 8,084,903 B2 * | 12/2011 | Goetze et al. | 310/71 |
| 8,278,790 B2 * | 10/2012 | Rueggen et al. | 310/68 D |
| 8,299,662 B2 * | 10/2012 | Schmidt et al. | 310/52 |
| 8,546,984 B2 * | 10/2013 | Heilman et al. | 310/68 R |
| 2009/0096301 A1* | 4/2009 | Sumi et al. | 310/89 |
| 2010/0247352 A1 | 9/2010 | Hansen et al. | |

* cited by examiner

*Primary Examiner* — Burton Mullins
(74) *Attorney, Agent, or Firm* — Michael Best & Friedrich LLP

(57) ABSTRACT

A motor assembly includes an electric motor having a stator and a rotor. A housing is coupled to the electric motor. The housing includes a terminal housing portion defining a first aperture and a second aperture. A power input terminal is disposed within the terminal housing portion. The power input terminal receives power input connections from at least one of the first aperture and the second aperture. A motor controller is disposed within the housing, the motor controller in communication with the power input terminals and the stator. A human machine interface (HMI) is in communication with the motor controller.

17 Claims, 6 Drawing Sheets ived within a fan housing 62.

ELECTRIC MOTOR WITH MULTIPLE POWER ACCESS

BACKGROUND

The invention relates to electric motors. More specifically, the invention relates to housings for electric motors.

Pump motors, such as for swimming pools, are often installed in locations that simplify plumbing and connections to related equipment. These installation locations often provide limited access to the pump motor due to the proximity of walls or other structures. Limited access may make it difficult to route power connections to terminals on the motor.

SUMMARY

In one embodiment, the invention provides a motor assembly including an electric motor having a stator and a rotor. A housing is coupled to the electric motor. The housing includes a terminal housing portion defining a first aperture and a second aperture. A power input terminal is disposed within the terminal housing portion. The power input terminal receives power input connections from at least one of the first aperture and the second aperture. A motor controller is disposed within the housing. The motor controller is in communication with the power input terminals and the stator. A human machine interface (HMI) is in communication with the motor controller.

In another embodiment, the invention provides a motor assembly. The motor assembly includes an electric motor having a stator housing, a stator disposed in the stator housing, and a rotor rotatably coupled to the stator housing for rotation with respect to the stator. A motor control module includes a controller housing coupled to the stator housing, a motor controller disposed within the controller housing, and an input terminal in communication with the motor. The controller housing includes a terminal housing portion defining a first aperture and a second aperture. A power input terminal is disposed within the terminal housing portion. The power input terminal receives power connections from at least one of the first aperture and the second aperture. A human machine interface (HMI) receives a user input and generates a control signal. An interface cord communicates the control signal from the HMI to the motor controller.

Other aspects of the invention will become apparent by consideration of the detailed description and accompanying drawings.

DETAILED DESCRIPTION

Before any embodiments of the invention are explained in detail, it is to be understood that the invention is not limited in its application to the details of construction and the arrangement of components set forth in the following description or illustrated in the following drawings. The invention is capable of other embodiments and of being practiced or of being carried out in various ways.

Figure 1:
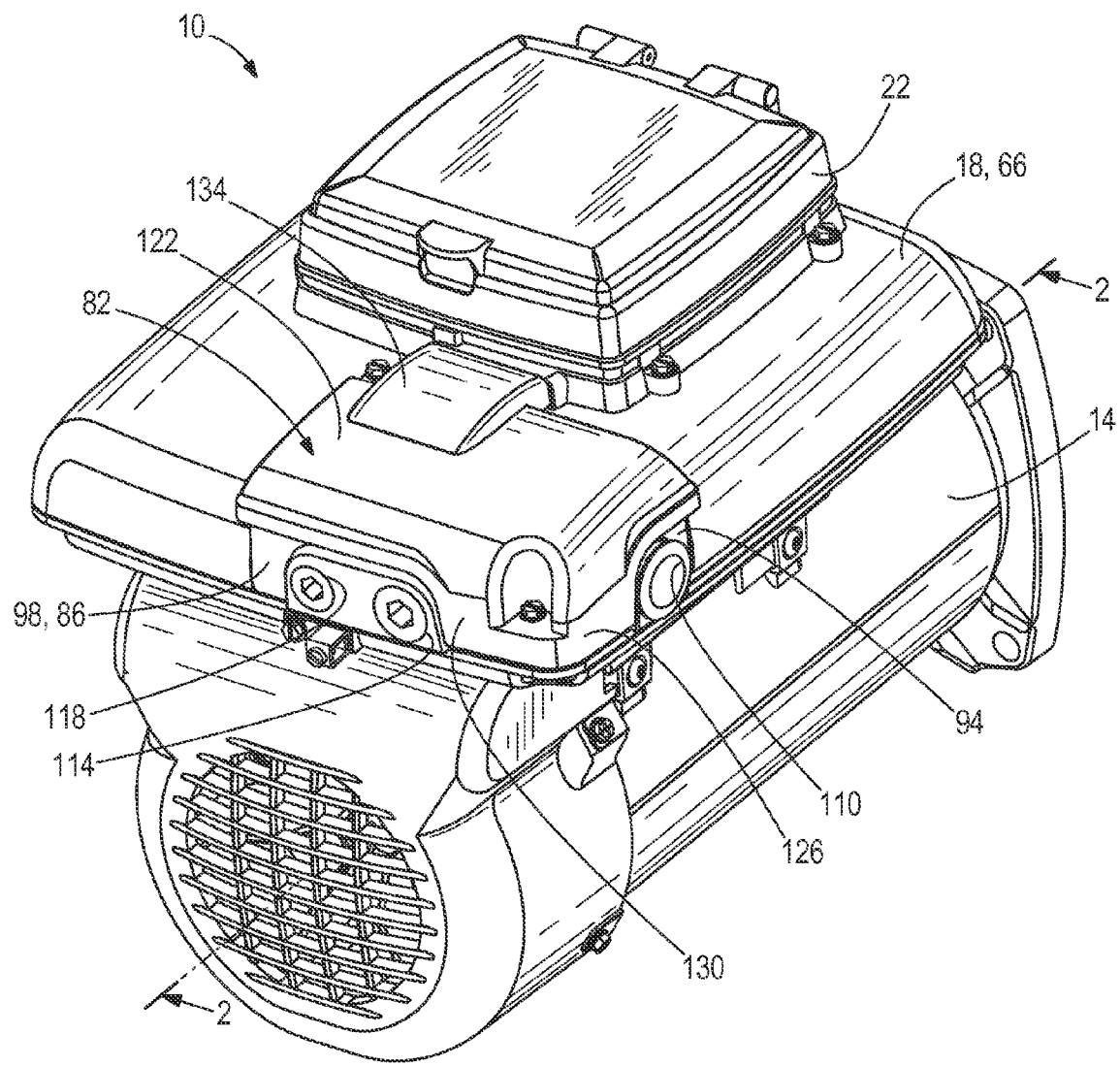
FIG. 1 is a perspective view of a motor assembly.

FIG. 1 illustrates a motor assembly 10, such as for use with a pump. The motor assembly 10 includes an electric motor 14, a motor control module 18, and a human machine interface (HMI) 22. The motor assembly 10 may be, for example, an electronically controlled, variable speed pump motor.

Figure 2:
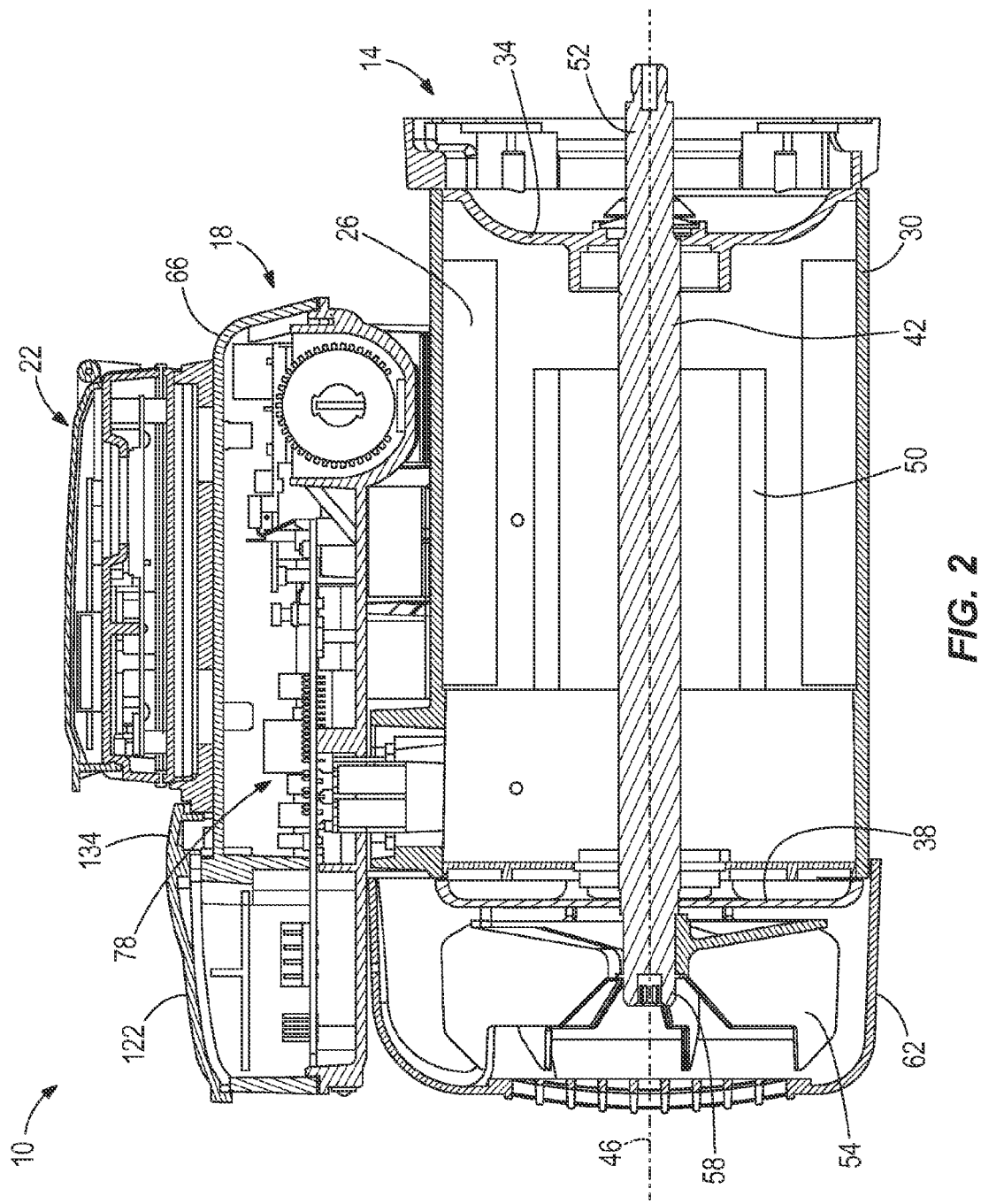
FIG. 2 is a cross sectional view along section line 2-2 of the motor assembly of FIG. 1.

Referring to FIG. 2, the electric motor 14 includes a stator 26 disposed within a stator housing 30. A first end frame 34 and a second end frame 38 are coupled to the stator housing 30. A rotor shaft 42 is rotatably coupled to the first end frame 34 and the second end frame 38 for rotation about an axis 46 within the stator 26. The rotor shaft 42 supports a rotor 50. The rotor 50 is operable to rotate with respect to the stator 26 as a result of applying a current through windings of the stator 26. A load end 52 of the rotor shaft 42, adjacent the first end frame 34, may be coupled to a pump or other load to be driven. A fan 54 is fixedly coupled to a fan end 58 of the rotor shaft 42, adjacent the second end frame 38. The fan 54 is disposed within a fan housing 62.

As shown in FIG. 1, the control module 18 includes a controller housing 66. Referring to FIG. 2, a motor controller 78 is disposed within the controller housing 66. The motor controller 78 may include a printed circuit board (PCB) as well as power electronics and overload circuitry that is integral to, or coupled to, the PCB.

Figure 3:
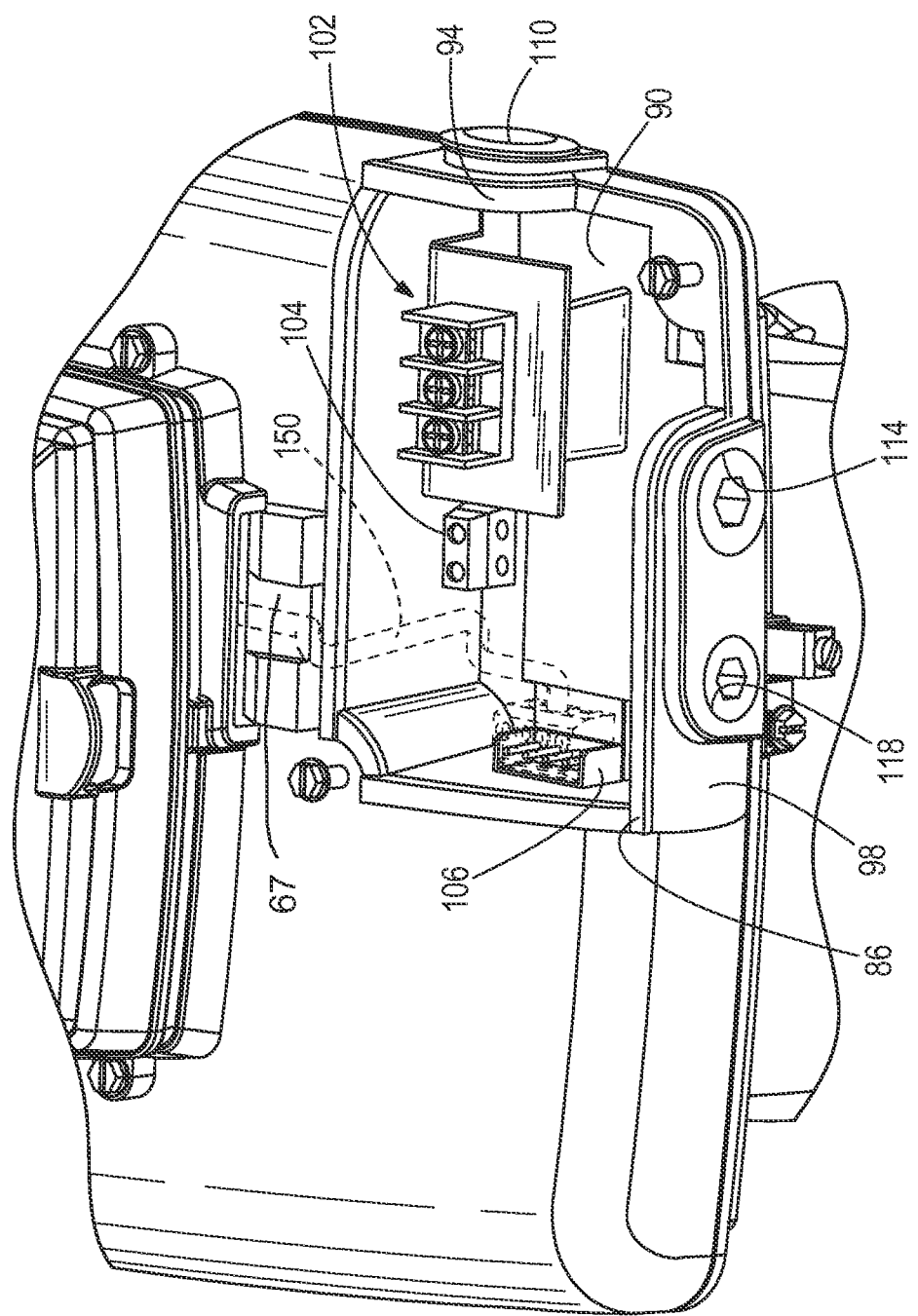
FIG. 3 is a perspective view of a terminal housing portion of the motor assembly of FIG. 1, with a terminal cover removed.
Figure 5:
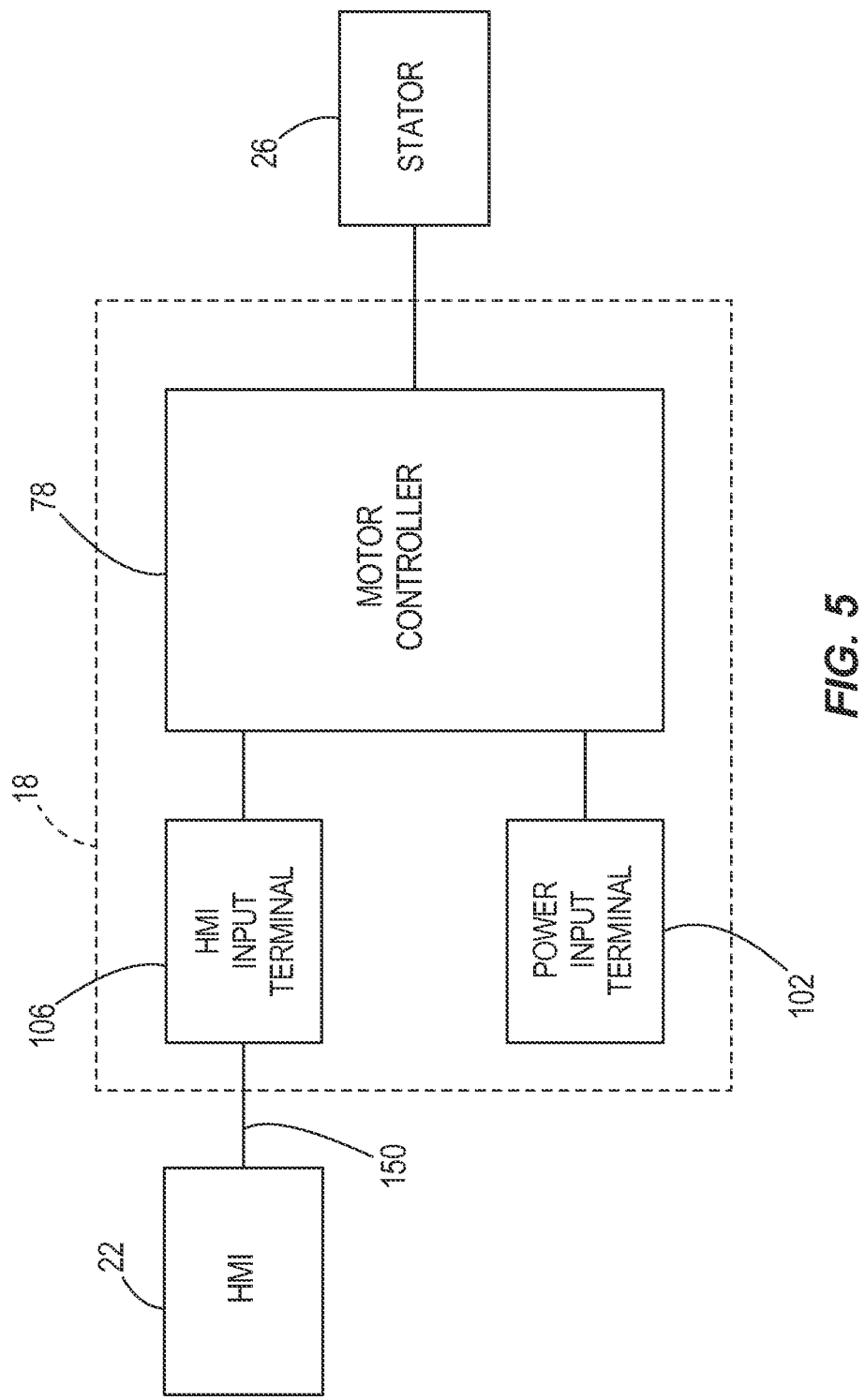
FIG. 5 is a block diagram of the motor assembly.

Referring back to FIG. 1, a terminal cover 82 is coupled to a terminal housing portion 86 of the controller housing 66. FIG. 3 illustrates the terminal housing portion 86 with the terminal cover 82 removed. The terminal housing portion 86 includes a base wall 90, a first lateral wall 94, and a second lateral wall 98. Power input terminals 102, an auxiliary load terminal 104, and an HMI input terminal 106 are coupled to the base wall. As shown in FIG. 5, the power input terminals 102 and HMI input terminal 106 are connected to the motor controller 78.

Figure 4:
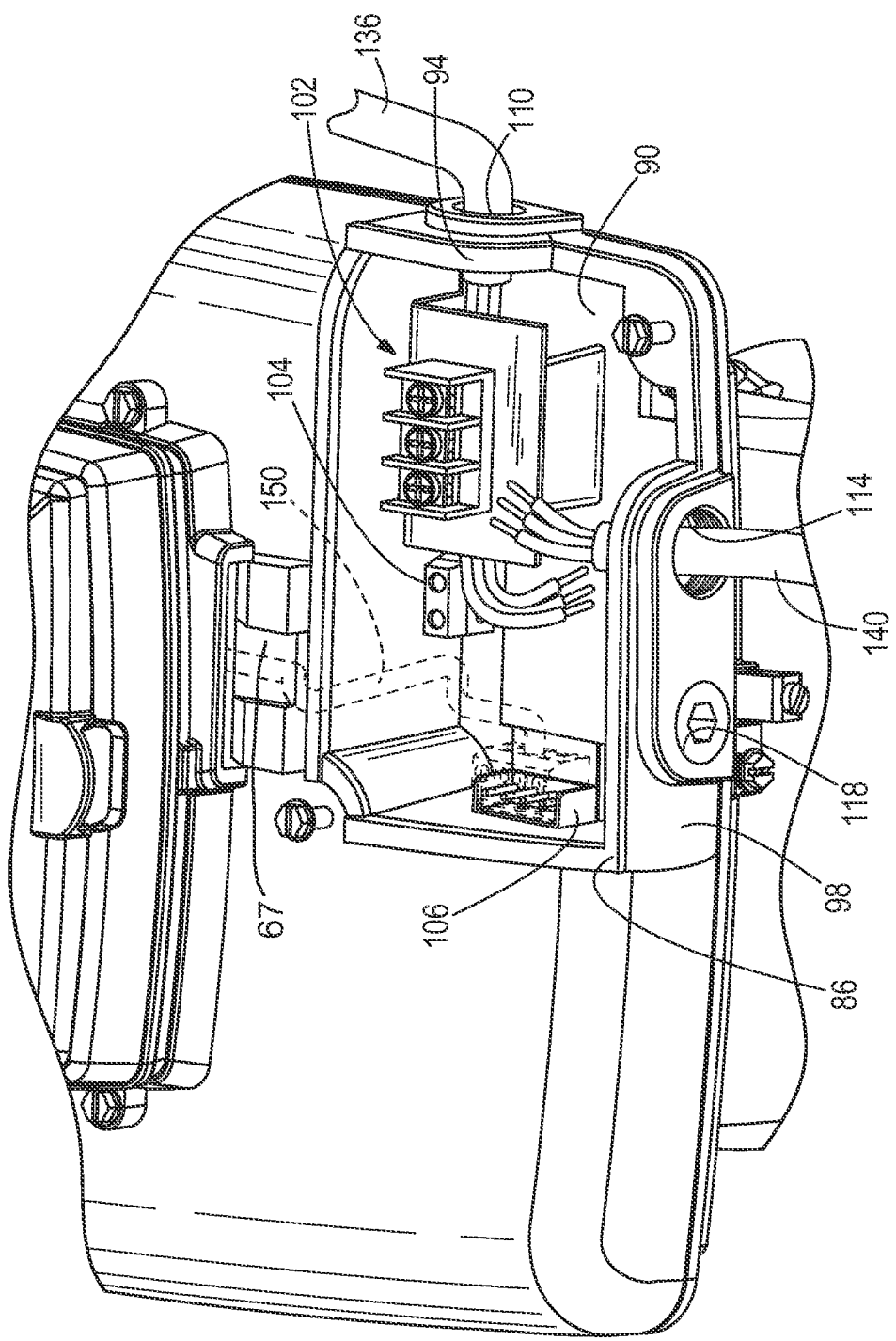
FIG. 4 is a perspective view of the terminal housing portion, with wire leads routed into the terminal housing portion.

In the illustrated construction of FIG. 3, the first lateral wall 94 and the second lateral wall 98 are substantially perpendicular, though in other constructions of the invention, the first lateral wall and second lateral wall may be disposed at other orientations with respect to each other. The first lateral wall 94 defines a first aperture 110. The second lateral wall 98 defines a second aperture 114. The second lateral wall 98 also defines a third aperture 118. Referring to FIG. 4, the first aperture 110 and the second aperture 114 are provided in order for a user or installer to have options in routing power connections. A first power cable 136 may be routed into the terminal housing portion 86 through the first aperture 110. A second power cable 140 may be routed into the terminal housing portion 86 through the second aperture 114. Having two cable routing options provides installers with greater flexibility when installing the motor assembly 10. Furthermore, the terminal housing portion 86 with a first aperture 110 and a second aperture 114 provides greater flexibility in applications where auxiliary equipment is powered from the auxiliary load terminal 104.

Figure 6:
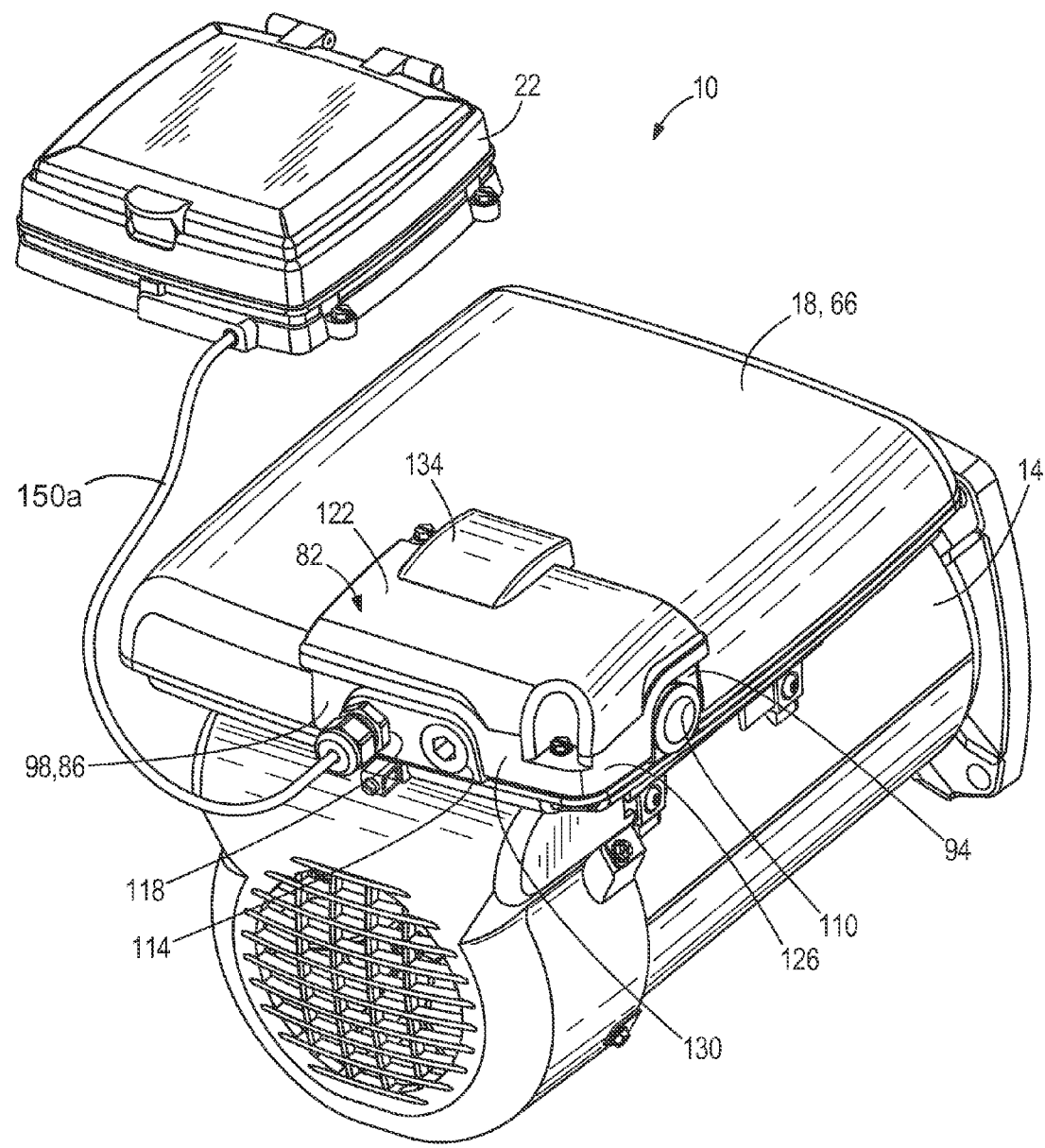
FIG. 6 is a perspective view of the motor assembly of FIG. 1 with a Human Machine Interface (HMI) shown in a detached position.

Referring back to FIG. 1, the terminal cover 82 includes a wall 122. The wall 122 defines a first lateral edge 126 contoured to engage the first lateral wall 94, and a second lateral edge 130 contoured to engage the second lateral wall 98. An interface shield 134 extends from the wall 122 towards the HMI 22. When the terminal cover 82 is coupled to the terminal portion 86, the interface shield 134 and controller housing 66 define an aperture 67 for routing an interface cord 150 (FIG. 3) from the HMI 22 into the terminal housing portion 86, to connect the HMI 22 to the HMI input terminal 106. When the interface cord 150 is connected to the input terminal 106 and the HMI 22, the interface cord 150 communicates control signals, such as user commands, from the HMI 22 to the motor controller 78. An external interface cord 150a may alternatively be connected to the HMI input terminal 106 by passing through the third aperture 118. The external interface cord 150a (shown in FIG. 6) may be used when the HMI 22 is detached from the controller housing 66 and disposed remotely.

FIG. 5 is a block diagram of the motor assembly 10, showing the interrelationships of the HMI 22, the motor controller 78, and the stator 26. Further discussion regarding an exemplary control of a motor 14, pump system, and pool system is described in U.S. patent application Ser. No. 13/285,524, filed on even date herewith, the entire content of which is incorporated herein by reference.

Thus, the invention provides, among other things, a new and useful motor assembly. Various features and advantages of the invention are set forth in the following claims.

What is claimed is:

1. A motor assembly comprising:
an electric motor including a stator and a rotor;
a housing coupled to the electric motor, the housing including a terminal housing portion defining a first aperture and a second aperture;
a power input terminal disposed within the terminal housing portion, the power input terminal for receiving power input connections from at least one of the first aperture and the second aperture;
a motor controller disposed within the housing, the motor controller in communication with the power input terminals and the stator;
a human machine interface (HMI) in communication with the motor controller and positionable in one of a first position in which the HMI is physically supported by the motor and a second position in which the HMI is physically spaced apart from the motor;
an interface cord communicating control signals from the HMI to the motor controller; and
an HMI input terminal coupled to the terminal housing portion, the HMI input terminal for receiving the interface cord, the interface cord entering the terminal housing through an interface aperture when the HMI is in the first position and an external interface cord passing through a third aperture, different than the interface aperture when the HMI is in the second position.

2. The motor assembly of claim 1, wherein the housing includes a stator housing and a controller housing.

3. The motor assembly of claim 2, wherein the terminal housing portion is defined by the controller housing.

4. The motor assembly of claim 1, wherein the terminal housing includes a first wall defining the first aperture and a second wall defining the second aperture.

5. The motor assembly of claim 4, wherein the first wall and the second wall are substantially perpendicular.

6. The motor assembly of claim 1, wherein the terminal housing portion defines the third aperture, the external interface cord extending through the third aperture when the HMI is in the second position.

7. The motor assembly of claim 1, further comprising a terminal cover coupled to the housing, the terminal cover substantially enclosing a portion of the terminal housing portion.

8. A motor assembly, comprising:
an electric motor including a stator housing, a stator disposed in the stator housing, and a rotor rotatably coupled to the stator housing for rotation with respect to the stator;
a motor control module including a controller housing coupled to the stator housing, a motor controller disposed within the controller housing, and an input terminal in communication with the motor, the controller housing including a terminal housing portion defining a first aperture and a second aperture;
a power input terminal disposed within the terminal housing portion, the power input terminal for receiving power connections from at least one of the first aperture and the second aperture;
a human machine interface (HMI) for receiving a user input and generating a control signal, the HMI positionable in one of a first position in which the HMI is physically supported by the electric motor and a second position in which the HMI is physically spaced apart from the electric motor; and
an interface cord communicating the control signal from the HMI to the motor controller, the interface cord entering the terminal housing portion through an interface aperture when the HMI is in the first position and an external interface cord passing through a third aperture, different than the interface aperture when the HMI is in the second position.

9. The motor assembly of claim 8, wherein the terminal housing portion includes a first wall defining the first aperture and a second wall defining the second aperture.

10. The motor assembly of claim 9, wherein the first wall and the second wall are substantially perpendicular.

11. The motor assembly of claim 9, wherein terminal housing portion further defines the third aperture.

12. The motor assembly of claim 11, wherein the third aperture is defined by one of the first wall and the second wall.

13. The motor assembly of claim 9, further comprising a terminal cover coupled to the controller housing.

14. The motor assembly of claim 13, wherein the terminal cover substantially encloses a portion of the terminal housing portion.

15. The motor assembly of claim 14, wherein the terminal cover substantially conforms to a profile of the first wall.

16. The motor assembly of claim 14, wherein the terminal cover substantially conforms to a profile of the first wall and a profile of the second wall.

17. A motor assembly, comprising:
an electric motor including a stator housing, a stator disposed in the stator housing, and a rotor rotatably coupled to the stator housing for rotation with respect to the stator;
a motor control module including a controller housing coupled to the stator housing, a motor controller disposed within the controller housing, and an input terminal in communication with the motor, the controller housing including a terminal housing portion defining a first aperture and a second aperture;
a power input terminal disposed within the terminal housing portion, the power input terminal for receiving power connections from at least one of the first aperture and the second aperture;
a human machine interface (HMI) for receiving a user input and generating a control signal, the HMI positionable in one of a first position in which the HMI is physically supported by the electric motor and a second position in which the HMI is physically spaced apart from the electric motor;

an interface cord communicating the control signal from the HMI to the motor controller; and an HMI input terminal coupled to the terminal housing portion, the HMI input terminal receiving the interface cord and in communication with the motor controller, the interface cord entering the terminal housing portion through an interface aperture when the HMI is in the first position and an external interface cord passing through a third aperture, different than the interface aperture when the HMI is in the second position.

\* \* \* \* \*